United States Patent
Hsu et al.

(10) Patent No.: US 7,573,353 B2
(45) Date of Patent: Aug. 11, 2009

(54) CIRCUIT TOPOLOGY FOR MULTIPLE LOADS

(75) Inventors: Shou-Kuo Hsu, Taipei Hsien (TW); Hsiao-Chuan Tu, Taipei Hsien (TW); Yu-Chang Pai, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 38 days.

(21) Appl. No.: 11/965,744

(22) Filed: Dec. 28, 2007

(65) Prior Publication Data

US 2009/0146759 A1      Jun. 11, 2009

(30) Foreign Application Priority Data

Dec. 6, 2007    (CN)    ......................... 2007 1 0202864

(51) Int. Cl.
*H01P 5/12* (2006.01)
*H03H 7/38* (2006.01)
(52) U.S. Cl. .................. 333/125; 333/130; 333/100
(58) Field of Classification Search ................ 333/100, 333/125–128, 130, 134, 136, 32, 33
See application file for complete search history.

(56) References Cited

U.S. PATENT DOCUMENTS

| | | | | |
|---|---|---|---|---|
| 3,904,990 A | * | 9/1975 | La Rosa | ...................... 333/128 |
| 4,460,877 A | * | 7/1984 | Sterns | .......................... 333/26 |
| 4,556,856 A | * | 12/1985 | Presser | ........................ 333/124 |
| 5,594,461 A | * | 1/1997 | O'Neill, Jr. | .................. 343/895 |
| 5,828,273 A | * | 10/1998 | Harrison | ...................... 333/127 |
| 6,600,384 B2 | * | 7/2003 | Mohwinkel et al. | ........ 333/22 R |
| 6,922,169 B2 | * | 7/2005 | Moh'd Izzat et al. | ......... 342/360 |
| 7,199,681 B2 | * | 4/2007 | Amirtharajah et al. | ....... 333/130 |
| 2005/0289632 A1 | * | 12/2005 | Brooks et al. | ................ 725/126 |

* cited by examiner

*Primary Examiner*—Benny Lee
*Assistant Examiner*—Kimberly E Glenn
(74) *Attorney, Agent, or Firm*—Frank R. Niranjan

(57) ABSTRACT

A circuit topology for multiple loads includes a driving terminal, a first node coupled to the driving terminal via a main transmission line, a second node coupled to the first node via a first branch transmission line, a first receiving terminal coupled to the first node via a second branch transmission line, a third node coupled to the second node via a third branch transmission line, and a second receiving terminal coupled to the second node via a fourth branch transmission line. The second branch transmission line is longer than the first transmission line, and a first resistor is connected in the second branch transmission line. The third branch transmission line is longer than the fourth branch transmission line, and a second resistor is connected in the third branch transmission line.

3 Claims, 4 Drawing Sheets

CIRCUIT TOPOLOGY FOR MULTIPLE LOADS

CROSS-REFERENCES TO RELATED APPLICATION

This application is related to a co-pending application entitled "CIRCUIT TOPOLOGY FOR MULTIPLE LOADS", filed on Aug. 14, 2007 with application Ser. No. 11/838,238, and assigned to the same assignee of the present invention.

BACKGROUND OF THE INVENTION

1. Field of the Invention

The present invention relates to a circuit topology, and particularly to a circuit topology for multiple loads on a motherboard.

2. Description of Related Art

With the increasing speeds of integrated circuits (ICs), signal integrity is becoming one of the most pressing problem areas. Many factors, such as the parameters of the electrical elements of the PCB and the layout of the PCB, can affect the signal integrity, or lead to instability of the system, possibly even causing the system to breakdown. Thus, preserving signal integrity has become a key point in the design of a PCB.

Referring to FIG. 3, a conventional circuit topology coupling a driving terminal to five signal receiving terminals is shown. A driving terminal 10 is coupled to five signal receiving terminals 20, 30, 40, 50 and 60 via corresponding transmission lines. The five signal receiving terminals 20, 30, 40, 50, and 60 are connected together in a daisy-chain configuration. The daisy-chain configuration includes four connection points A, B, C, and D. In this circuit topology, the distances a signal travels from the driving terminal 10 to the signal receiving terminals 20, 30, 40, 50, and 60 are different.

Referring to FIG. 4, a graph illustrating signal waveforms 22, 33, 44, 55, and 66 respectively obtained at receiving terminals 20, 30, 40, 50, and 60 using the circuit topology of FIG. 3 is shown. Signals arriving at the receiving terminals 20, 30 reflect back and forth along the transmission line causing "ringing" at receiving terminals 20 and 30.

What is needed, therefore, is a circuit topology which can eliminate the signal reflections and enhance signal integrity.

SUMMARY

An exemplary circuit topology for multiple loads includes a driving terminal, a first node coupled to the driving terminal via a main transmission line, a second node coupled to the first node via a first branch transmission line, a first receiving terminal coupled to the first node via a second branch transmission line, a third node coupled to the second node via a third branch transmission line, and a second receiving terminal coupled to the second node via a fourth branch transmission line. The second branch transmission line is longer than the first transmission line, and a first resistor is connected in the second branch transmission line. The third branch transmission line is longer than the fourth branch transmission line, and a second resistor is connected in the third branch transmission line.

Other objects, advantages and novel features of the present invention will become more apparent from the following detailed description of preferred embodiments when taken in conjunction with the accompanying drawings, in which:

DETAILED DESCRIPTION

Figure 1:
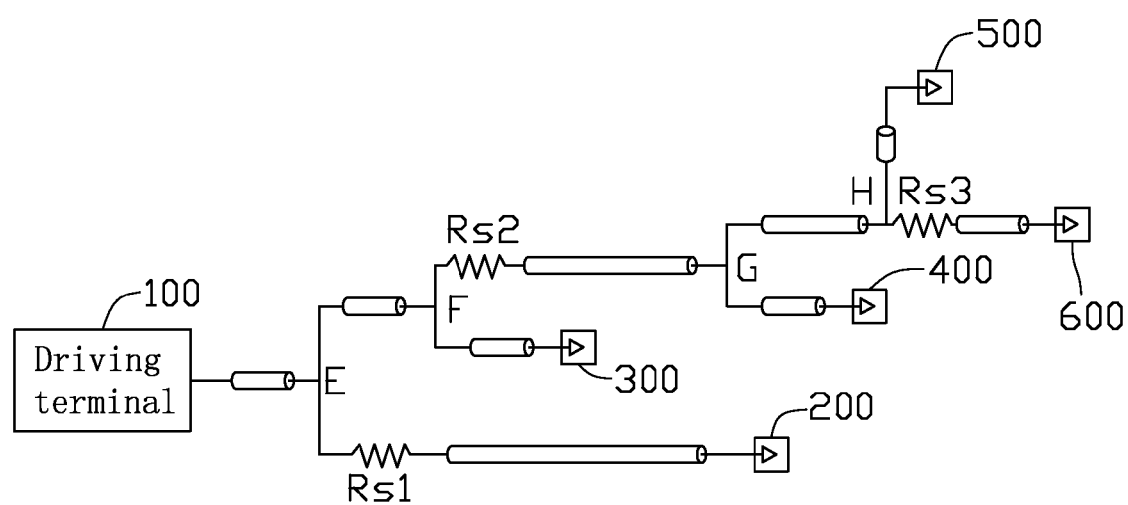
FIG. 1 is a block diagram of a circuit topology for multiple loads in accordance with an embodiment of the present invention.

Referring to FIG. 1, a circuit topology for multiple loads in accordance with an embodiment of the present invention is shown. A driving terminal 100 is coupled to a first node E via a main transmission line. The first node E is coupled to a second node F and a first signal receiving terminal 200 via a first branch transmission line and a second branch transmission line respectively. The second node F is coupled to a third node G and a second signal receiving terminal 300 via a third branch transmission line and a fourth branch transmission line respectively. The third node G is coupled to a fourth node H and a third signal receiving terminal 400 via a fifth transmission line and a six branch transmission line respectively. The fourth node H is couple to a fourth signal receiving terminal 500 and a sixth signal receiving terminal 600 via a seventh branch transmission line and an eighth branch transmission line respectively.

In this embodiment, the length of the second branch transmission line is greater than that of the first branch transmission line, a first resistor RS1 is connected in the second branch transmission line. The length of the third branch transmission line is greater than that of the fourth branch transmission line, a second resistor RS1 is connected in the third branch transmission line. The length of the fifth branch transmission line is greater than that of the sixth branch transmission line, the third receiving terminal 400 is a test point configured to detect errors of the circuit topology for multiple loads. The length of the eighth branch transmission line is greater than that of the seventh branch transmission line, a third resistor RS3 is connected in the eighth branch transmission line.

When the driving terminal 100 sends signals to the signal receiving terminals 200, 300, 400, 500 and 600, the first resistor RS1 weakens the signals transmitted to the second signal receiving terminal 200, the second resistor RS2 increases the voltage level of the signals arriving at the receiving terminal 300, and the third resistor RS3 decreases the overshoot at the receiving terminal 600.

Figure 2:
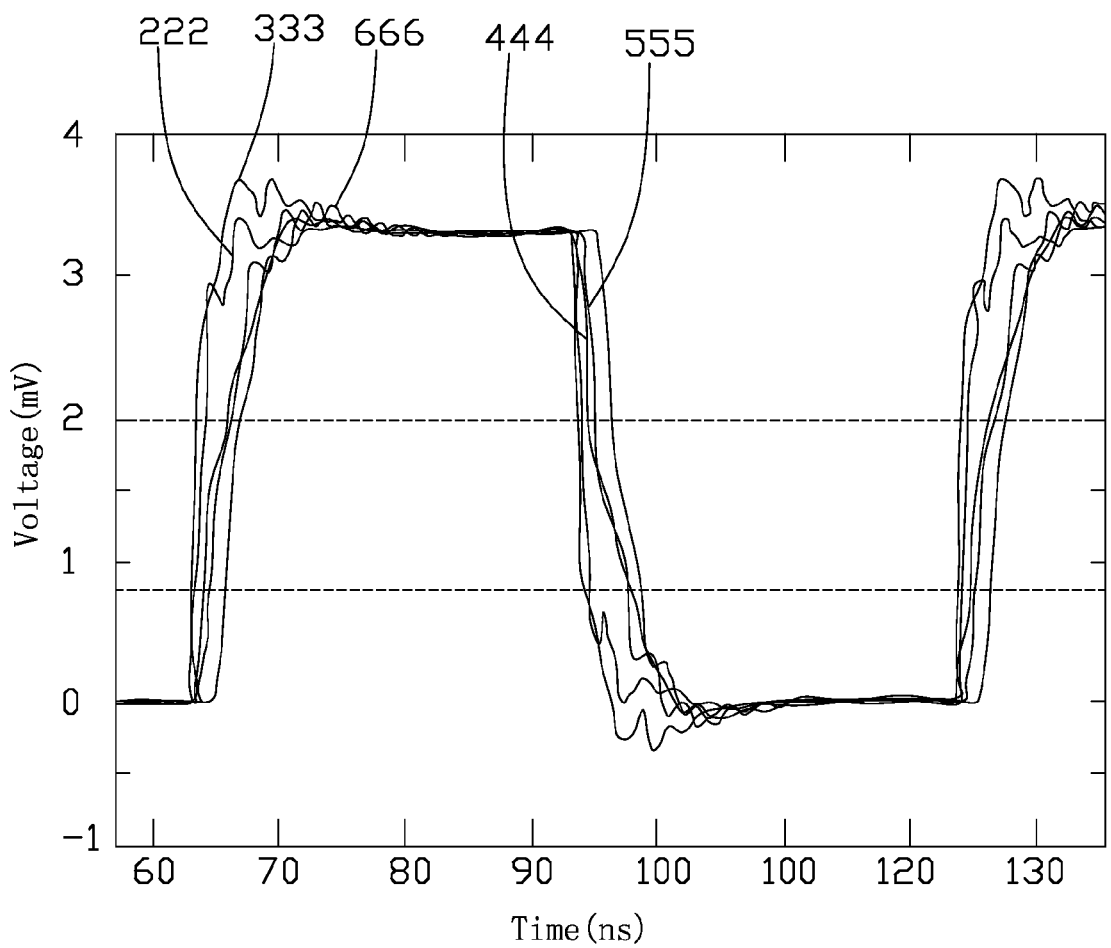
FIG. 2 is a comparative graph showing signal waveforms obtained at each signal receiving terminal using the circuit topology of FIG. 1.
Figure 3:
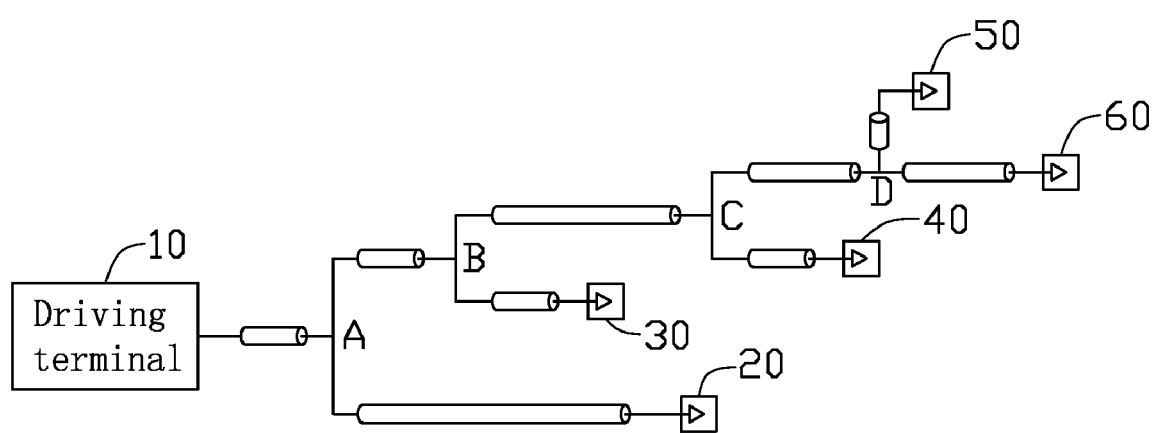
FIG. 3 is a block diagram of a conventional circuit topology coupling a driving terminal to five signal receiving terminals.
Figure 4:
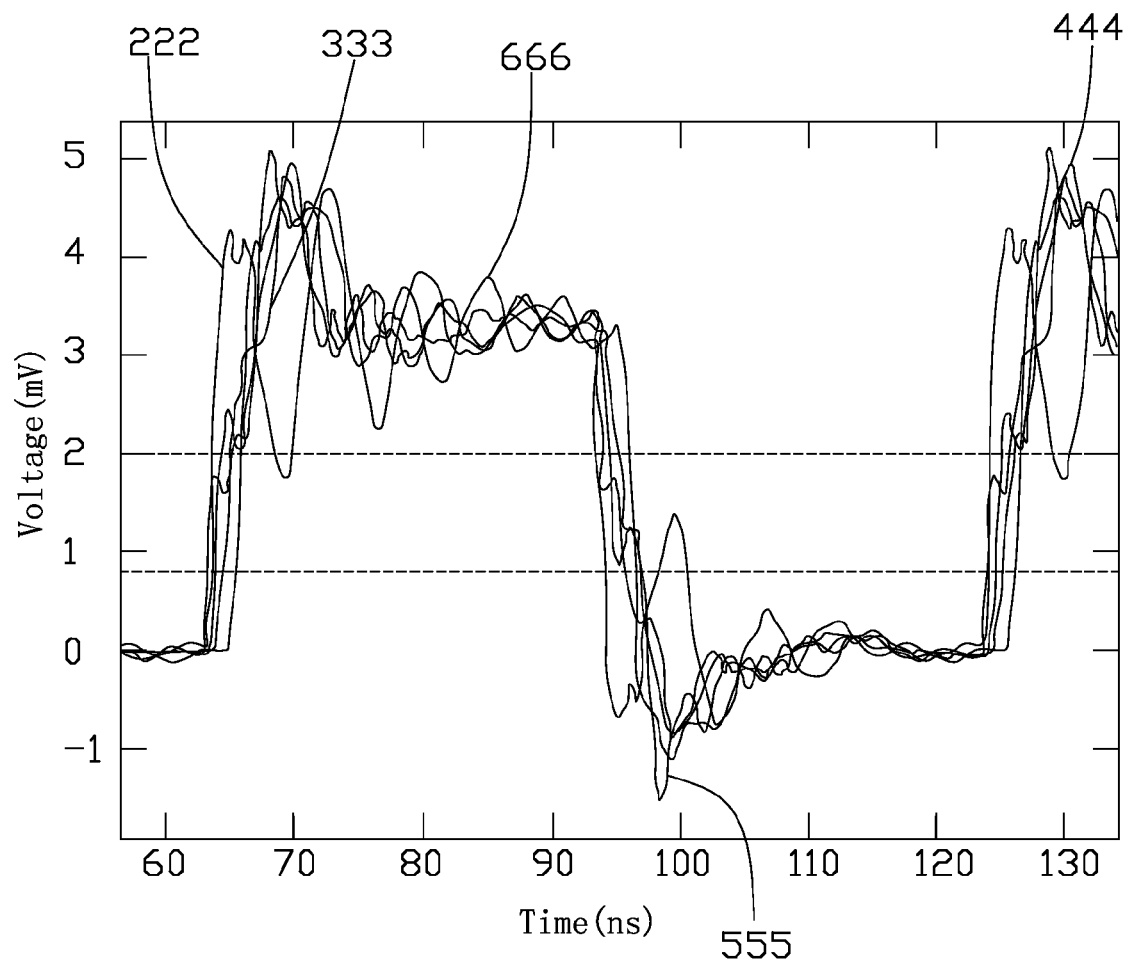
FIG. 4 is a comparative graph showing signal waveforms obtained at each signal receiving terminal using the circuit topology of FIG. 3.

FIG. 2 is a graph showing signal waveforms obtained at each signal receiving terminal 200, 300, 400, 500, and 600 using the circuit topology of FIG. 1. Signal waveforms 222, 333, 444, 555, and 666 correspond to the signal receiving terminals 200, 300, 400, 500, and 600. Compared with FIG. 2, it can be seen that signal reflections are reduced and signal integrity at each receiving terminals 200, 300, 400, 500, and 600 is improved.

In the above-described circuit topology of the embodiment of the present invention, the driving terminal 100, and the signal receiving terminals 200, 300, 400, 500, and 600 are used as examples. In other embodiments, the circuit topology with a resistor connected to the receiving terminal to which a signal travels a greater distance and without a resistor connected to the receiving terminal which has no function of data transmission may be used for any other multiple loads on a PCB.

The foregoing description of the exemplary embodiment of the invention has been presented only for the purposes of illustration and description and is not intended to be exhaustive or to limit the invention to the precise forms disclosed. Many modifications and variations are possible in light of the above teaching. The embodiment was chosen and described in order to explain the principles of the invention and its practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiment described therein.

What is claimed is:

1. A circuit topology for multiple loads comprising:
   a driving terminal;
   a first node coupled to the driving terminal via a main transmission line;
   a second node coupled to the first node via a first branch transmission line;
   a first receiving terminal coupled to the first node via a second branch transmission line, the second branch transmission line being longer than the first transmission line, and a first resistor connected in the second branch transmission line;
   a third node couple to the second node via a third branch transmission line; and
   a second receiving terminal coupled to the second node via a fourth branch transmission line, the third branch transmission line being longer than the fourth branch transmission line, and a second resistor connected in the third branch transmission line.

2. The circuit topology for multiple loads as claimed in claim 1, further comprising: a fourth node coupled to the third node via a fifth branch transmission line; a third receiving terminal being a test point configured to detect errors of the circuit topology for multiple loads coupled to the third node via a sixth branch transmission line, the fifth branch transmission line being longer than the sixth branch transmission line.

3. The circuit topology for multiple loads as claimed in claim 2, further comprising: a fourth receiving terminal coupled to the fourth node via a seventh branch transmission line; and an fifth receiving terminal coupled to the fourth node via an eighth branch transmission line, the eighth branch transmission line being longer than the seventh branch transmission line, and a third resistor connected in the eighth branch transmission line.

* * * * *